(12) United States Patent
Xu et al.

(10) Patent No.: US 10,784,148 B2
(45) Date of Patent: Sep. 22, 2020

(54) FORMING UNIFORM FIN HEIGHT ON OXIDE SUBSTRATE

(71) Applicant: International Business Machines Corporation, Armonk, NY (US)

(72) Inventors: Peng Xu, Santa Clara, CA (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 15/958,769

(22) Filed: Apr. 20, 2018

(65) Prior Publication Data

US 2019/0326163 A1    Oct. 24, 2019

(51) Int. Cl.
| | | |
|---|---|---|
| *H01L 21/762* | (2006.01) | |
| *H01L 29/66* | (2006.01) | |
| *H01L 27/088* | (2006.01) | |
| *H01L 21/84* | (2006.01) | |

(52) U.S. Cl.
CPC ...... *H01L 21/76283* (2013.01); *H01L 21/845* (2013.01); *H01L 27/0886* (2013.01); *H01L 29/6681* (2013.01); *H01L 29/66545* (2013.01)

(58) Field of Classification Search
CPC combination set(s) only.
See application file for complete search history.

(56) References Cited

U.S. PATENT DOCUMENTS

| | | |
|---|---|---|
| 8,617,961 B1 | 12/2013 | Haran et al. |
| 8,951,850 B1 | 2/2015 | He et al. |
| 9,070,742 B2 | 6/2015 | Xie et al. |
| 9,431,306 B2 | 8/2016 | Jacobs et al. |
| 9,478,549 B2 | 10/2016 | Cheng et al. |
| 9,627,245 B2 | 4/2017 | Jacobs et al. |
| 9,853,131 B1 | 12/2017 | Cheng et al. |
| 2008/0128797 A1 | 6/2008 | Dyer et al. |
| 2016/0064417 A1 | 3/2016 | Ponoth et al. |

OTHER PUBLICATIONS

Lee et al., "Feature-Size Dependence of Etch Rate in Reactive Ion Etching," J. Electrochem. Soc., vol. 138, issue 8, pp. 2439-2445 (Aug. 1991).
Fang et al., "SAQP Pitch walk metrology using single target metrology," Proc. of SPIE, vol. 10145 (Mar. 2017).
M. Nawaz et al., "Full 3D Process and Device Simulation for FinFET optimization," 2005 International Semiconductor Device Research Symposium, Dec. 7-9, 2005, pp. 40-41.

*Primary Examiner* — Tony Tran
(74) *Attorney, Agent, or Firm* — Daniel Morris; Michael J. Chang, LLC

(57) ABSTRACT

Techniques for forming uniform fin height on oxide substrates for finFET devices is provided. In one aspect, a method for forming a finFET device includes: patterning fins in a wafer; burying the fins in an oxide material; recessing the oxide material to form a recessed oxide material in between the fins; selectively forming sidewall spacers, above the recessed oxide material, alongside top portions of one or more of the fins that serve as active fins of the finFET device; converting bottom portions of the one or more fins beneath the sidewall spacers to an oxide, such that the active fins are present on the oxide; and forming gates over the active fins. A finFET device is also provided.

11 Claims, 10 Drawing Sheets

FORMING UNIFORM FIN HEIGHT ON OXIDE SUBSTRATE

FIELD OF THE INVENTION

The present invention relates to fin field-effect transistor (finFET) devices, and more particularly, to techniques for forming uniform fin height on oxide substrates for finFET devices.

BACKGROUND OF THE INVENTION

Continued scaling in complementary metal oxide semiconductor (CMOS) technology offers some notable challenges. For instance, with regard to patterning fins for fin field-effect transistor (finFET) devices, scaling makes it difficult to precisely control the fin height due to variation in the fin patterning depth. Forming gates alongside fins with an uneven depth undesirably results in variation in fin height, even for a given fin which could end up with a different fin height on its left versus right sides.

It is also desirable to be able to provide active fin isolation by forming the fins on an insulator, such as an oxide, to improve device performance. However, differences in patterned fin height can be problematic for consistent definition of the active fin over the insulator.

Therefore, techniques for forming active fin of a uniform height on an insulator for finFET device fabrication would be desirable.

SUMMARY OF THE INVENTION

The present invention provides techniques for forming uniform fin height on oxide substrates for fin field-effect transistor (finFET) devices. In one aspect of the invention, a method for forming a finFET device is provided. The method includes: patterning fins in a wafer, burying the fins in an oxide material; recessing the oxide material to form a recessed oxide material in between the fins; selectively forming sidewall spacers, above the recessed oxide material, alongside top portions of one or more of the fins that serve as active fins of the finFET device; converting bottom portions of the one or more fins beneath the sidewall spacers to an oxide, such that the active fins are present on the oxide; and forming gates over the active fins.

In another aspect of the invention, a finFET device is provided. The finFET device includes: fins patterned in a wafer, wherein top portions of one or more of the fins serve as active fins of the finFET device; an oxide material surrounding bottom portions of the fins, wherein the bottom portions of the fins include an oxide, such that the active fins are present on the oxide; and gates disposed over the fins.

A more complete understanding of the present invention, as well as further features and advantages of the present invention, will be obtained by reference to the following detailed description and drawings.

DETAILED DESCRIPTION OF PREFERRED EMBODIMENTS

Figure 1:
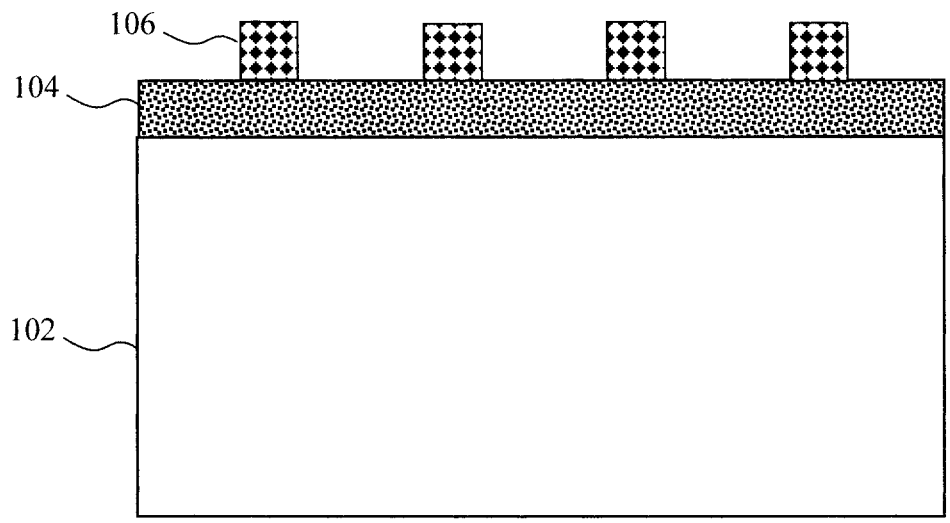
FIG. 1 is a cross-sectional diagram illustrating a hardmask layer having been deposited onto a wafer, and mandrels having been patterned on the hardmask layer according to an embodiment of the present invention.
Figure 2:
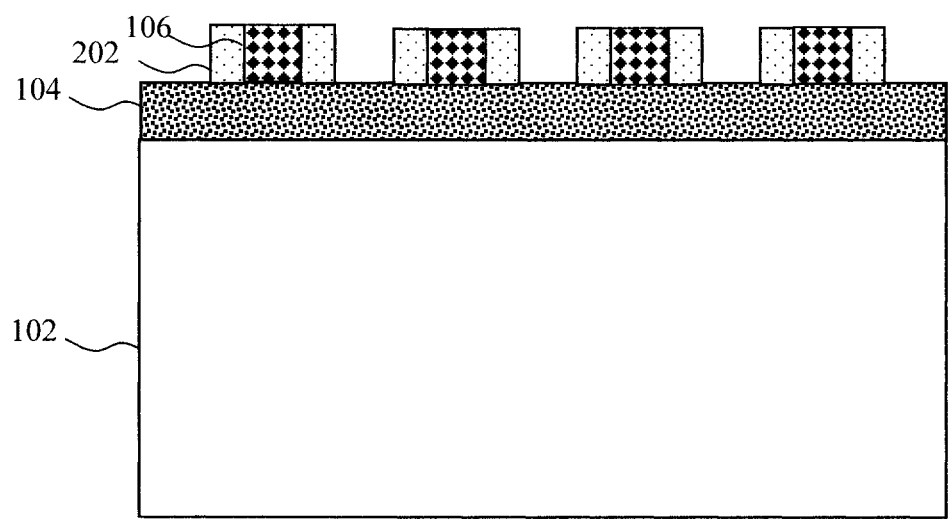
FIG. 2 is a cross-sectional diagram illustrating sidewall spacers having been formed on opposite sides of the mandrels according to an embodiment of the present invention.
Figure 3:
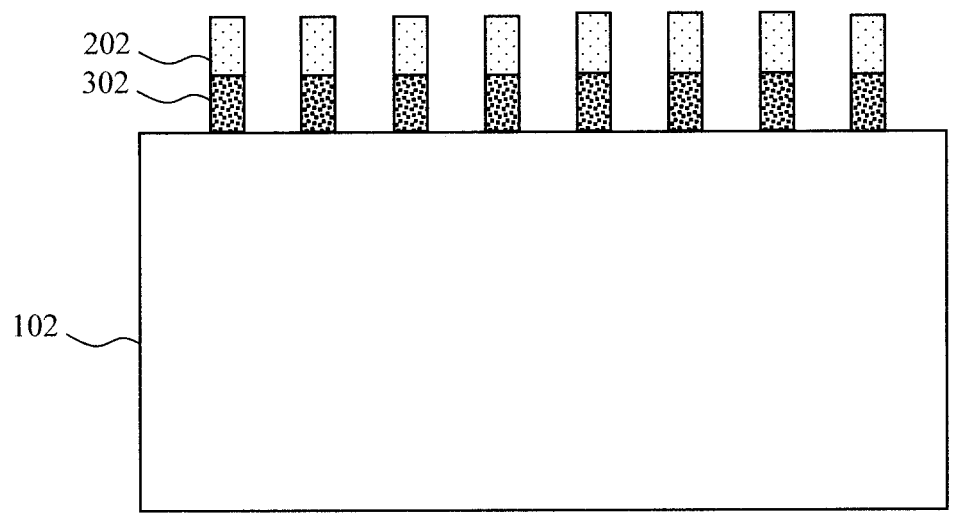
FIG. 3 is a cross-sectional diagram illustrating the mandrels having been removed selective to the sidewall spacers, and the sidewall spacers having been used to pattern the hardmask layer into individual fin hardmasks on the wafer according to an embodiment of the present invention.

Provided herein are techniques for forming active fins of uniform height on an insulator for a fin field effect (finFET) device. As will be described in detail below, the present techniques involve patterning a sea of fins in a wafer. An oxidation process is then used to selectively convert a bottom portion of one or more of the fins into an oxide thereby providing an insulator below what will be active fins of the device. Variations in the fin patterning depth are most likely to affect those fins at the edges of the sea of fins. Using the same oxidation process, those 'end' fins are permitted to be converted entirely to oxide making them non-active, dummy fins, thereby avoiding any discrepancies in fin depth.

Variations in the fin patterning depth arise due to slight variations in the lithography and etching processes used to pattern fins. Ideally, the patterned sea of fins would have a uniform fin pitch and depth. Fin pitch is the distance between a given point on one fin to the same given point on the adjacent fin. However, both fin pitch and depth can deviate due to process variations such as fin pitch walking. In fact, fin pitch is often proportional to the fin reveal depth based on a decrease in etch rate that occurs with a decrease in feature size. See, for example, Lee et al., "Feature-Size Dependence of Etch Rate in Reactive Ion Etching," J. Electrochem. Soc., vol. 138, issue 8, pgs. 2439-2445 (August 1991), the contents of which are incorporated by reference as if fully set forth herein.

An exemplary embodiment for forming a finFET device in accordance with the present techniques is now described by way of reference to FIGS. 1-19. The process begins by forming a plurality of fin hardmasks on a wafer marking the footprint and location of the fins. A variety of different techniques can be used to pattern the fin hardmasks such as direct patterning (using standard lithography and etching techniques) or, as shown illustrated in the figures, a sidewall image transfer (SIT) process. SIT, also sometimes referred to as self-aligned double patterning (SADP), involves patterning mandrels over a hardmask layer, and then using those mandrels to place sidewall spacers. The mandrels are removed selective to the sidewall spacers, which are then used to pattern the hardmask layer into individual fin hardmasks. The SIT process is a pitch doubling technique, since for each (patterned) mandrel there will be two resulting spacers/fin hardmasks. Thus, SIT can be used to pattern fins at a sub-lithographic pitch, i.e., a pitch smaller than what is achievable using direct lithographic patterning. A process wherein the SIT steps are repeated is referred to as self-aligned quadruple patterning (SAQP). The SAQP process is described, for example, in Fang et al., "SAQP Pitch walk metrology using single target metrology," Proc. of SPIE, vol. 10145 (March 2017) (7 total pages), the contents of which are incorporated by reference as if fully set forth herein.

To begin the SIT patterning process, a hardmask layer 104 is deposited onto a wafer 102. See FIG. 1. According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Suitable materials for the hardmask layer 104 include, but are not limited to, nitride materials such as silicon nitride (SiN).

Standard lithography and etching techniques are then used to pattern mandrels 106 on the hardmask layer 104. The mandrels 106 are a sacrificial structure used merely to place the sidewall spacers for fin patterning. Thus, the mandrels 106 are formed from a material that can be selectively removed relative to the sidewall spacers. Suitable materials for the mandrels 106 include, but are not limited to, amorphous Si, poly-silicon (poly-Si), amorphous carbon, SiGe, an organic planarization layer (OPL), silicon dioxide ($SiO_2$) and/or SiN. It is notable that even if the intent is to pattern evenly sized/evenly spaced mandrels 106, some variation is inevitable especially at smaller feature sizes. These variations can lead to pitch variability in the patterned fins.

Following patterning of the mandrels 106, sidewall spacers 202 are formed on opposite sides of the mandrels 106. See FIG. 2. By way of example only, a suitable spacer material is blanket deposited onto and covering the mandrels 106 and the spacer material is then patterned into the individual sidewall spacers 202. Suitable materials for spacers 202 include, but are not limited to, $SiO_2$, SiN, silicon oxynitride (SiON), silicon carbide (SiC) and/or amorphous carbon. However, as provided above, the mandrels 106 will be removed selective to the spacers 202. Thus, the choice of mandrel and spacer material should be made to permit this selectivity. For instance, when the mandrels 106 are formed from a nitride such as SiN, the spacers 202 can be formed from an oxide such as $SiO_2$, or vice versa. As such, an oxide- or nitride-selective etch can be used to remove one (oxide or nitride) relative to the other.

The mandrels 106 are then removed selective to the sidewall spacers 202, and the sidewall spacers 202 are used to pattern the hardmask layer 104 into individual fin hardmasks 302 on the wafer 102. See FIG. 3. Following the etch of the hardmask layer 104, any remaining portions of the sidewall spacers 202 can be removed.

Figure 4:
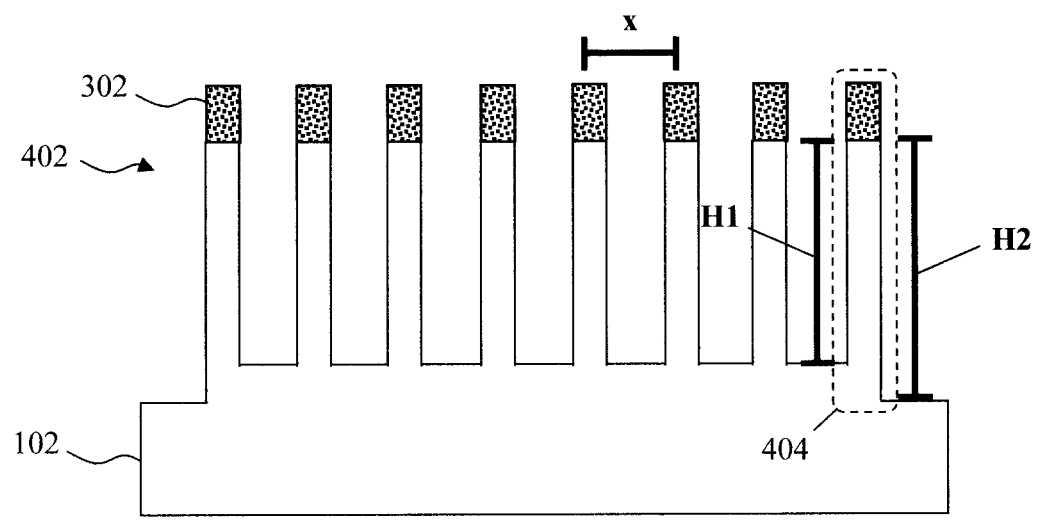
FIG. 4 is a cross-sectional diagram illustrating a sea of fins having been patterned in the wafer using the fin hardmasks according to an embodiment of the present invention.

A 'sea' of fins 402 is patterned in the wafer 102 using the fin hardmasks 302. See FIG. 4. As shown in FIG. 4, the patterned fins 402 extend partway through the wafer 102. A directional (i.e., anisotropic) etching process such as reactive ion etching (RIE) can be employed for the fin etch. It is notable that, while shown in the figures as having vertical sidewalls, in practice the fins 402 as patterned can have sloping sidewalls such that the fins taper from the bottom to top.

As shown in FIG. 4, the fins 402 have a uniform pitch x, however due to slight variations in the patterning depth (see above) at the edges of the sea of fins the 'end' fins 402 are patterned having a slightly greater outer depth. See, for example, the end fin 402 enclosed within dashed box 404 which has height H1 on its left side and height H2 on its right side, wherein H1<H2.

Figure 5:
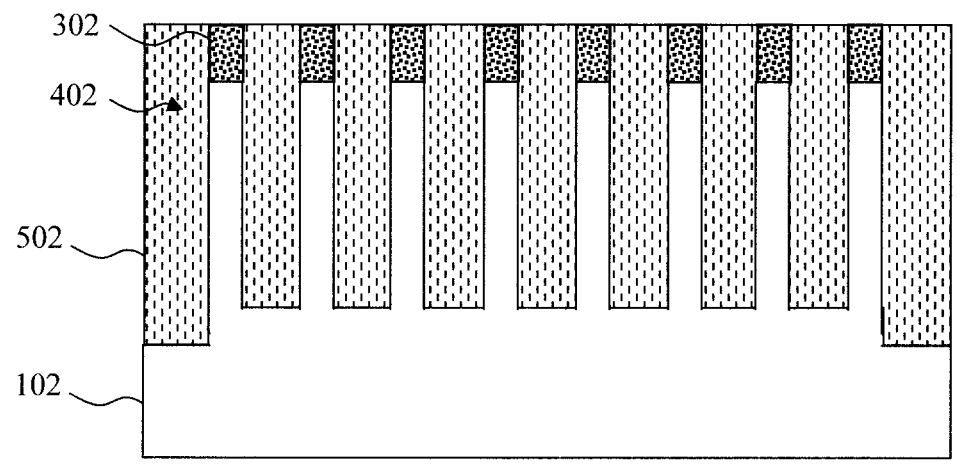
FIG. 5 is a cross-sectional diagram illustrating the fins having been buried in an oxide material according to an embodiment of the present invention.
Figure 6:
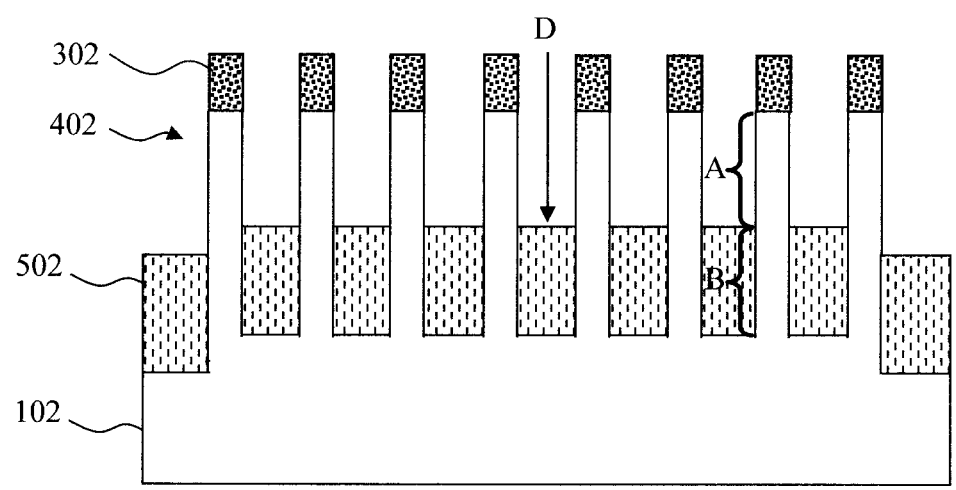
FIG. 6 is a cross-sectional diagram illustrating the oxide material having been recessed according to an embodiment of the present invention.

As will be described in detail below, gates will be formed alongside the fins 402, whereby the fin height sets the gate length (Lgate) of the device. Thus, the fin height is an important consideration. However, as highlighted above, the end fins will be converted to dummy fins through an oxidation process. Thus, any patterning depth variation in these end fins will be inconsequential since they will not serve as an active fin channel of the device. As also highlighted above, this oxidation process is also employed herein to convert the fins 402 below the active fins to an oxide, such that the active fins are present on an insulator. To do so, the top portions of these (active) fins 402 need to be masked in order to prevent oxidation of the active fin itself (i.e., oxidation of only bottom portions below the active fins 402 is desired). As will be described in detail below, this masking process involves depositing an oxide material between the fins 402 and then recessing the oxide material to expose the top portions of the fins 402. An oxide material is permeable to oxygen during the oxidation. Spacers are then selectively formed alongside the top portions of the active fins 402 (i.e., not alongside the dummy fins 402). That way, when the oxidation is carried out, only the bottom portions of the active fins 402 will be converted to oxide, whereas the conversion will affect the entire dummy fins 402. Namely, the fins 402 are next buried in an oxide material 502. See FIG. 5. Suitable oxide materials include, but are not limited to, silicon dioxide ($SiO_2$) and/or silicon oxycarbide (SiOC). As shown in FIG. 5, the oxide material 502 is then polished down to the fin hardmasks 302 using a process such as chemical-mechanical polishing (CMP).

Figure 7:
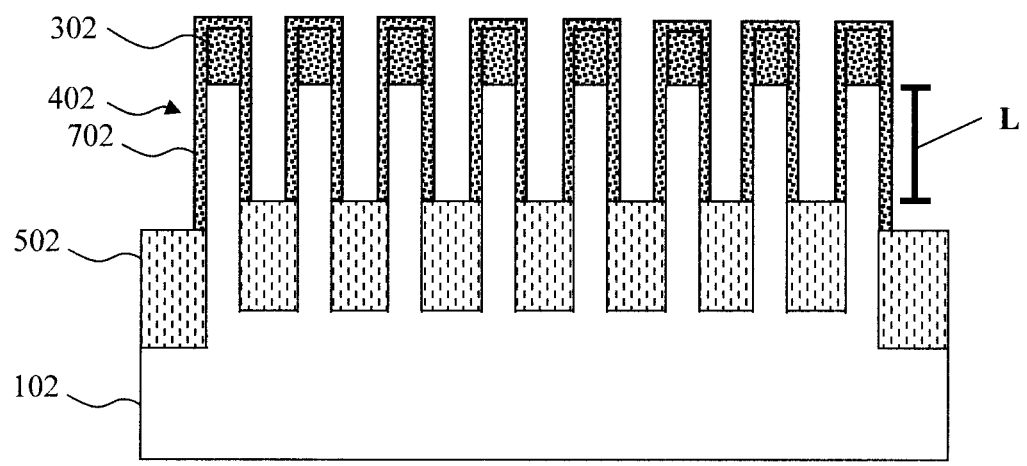
FIG. 7 is a cross-sectional diagram illustrating sidewall spacers having been formed alongside opposite sides of the top portions of the fins above the recessed oxide material according to an embodiment of the present invention.

The oxide material 502 is then recessed. See FIG. 6. Once recessed, the oxide material 502 surrounds the bottom portions of each of the fins 402. An oxide-selective etching process, such as an oxide-selective RIE can be used for the recess etch. As shown in FIG. 7, due to the variable fin depth at the outer/end fins 402, the recessed oxide material 502 may also have variability in that region. However, as provided above, this affect is inconsequential since these end fins 402 will be converted to dummy fins. For the active fins 402, the top portions A will serve as the active fins, while the bottom portions B will be converted to an oxide (whereas for the dummy fins, the entire fin will be converted to an oxide). The depth D of the recess of oxide material 502 divides the top portions A from the bottom portions B of the fins 402. Namely, the top portions A are those portions of the fins 402 present above the (recessed) oxide material 502, and the bottom portions B are those portions of the fins 402 present below the top surface of the oxide material 502.

Sidewall spacers 702 are then formed alongside opposite sides of the top portions of the fins 402 (and over the tops and sides of the fin hardmasks 302). See FIG. 7. Suitable sidewall spacer materials include, but are not limited to, SiN and/or SiON. According to an exemplary embodiment, the sidewall spacer material is deposited over the fins 402/fin hardmasks 302 using a conformal deposition process such as chemical vapor deposition (CVD) or atomic layer deposition (ALD). As shown in FIG. 7, the sidewall spacers 702 cover a same length L of the top sidewall portion of each active fin 402. This aspect is notable since the sidewall spacers 702 will set the length of the active fins (the top portions of the fins 402) with respect to the bottom portions of the fins 402 that will be converted to an oxide. While the varying dimensions of the end fins 402 introduce variation into the sidewall spacers 702 alongside those end fins 402, the effect is inconsequential because the sidewall spacers 702 alongside those end fins 402 will next be removed.

Figure 8:
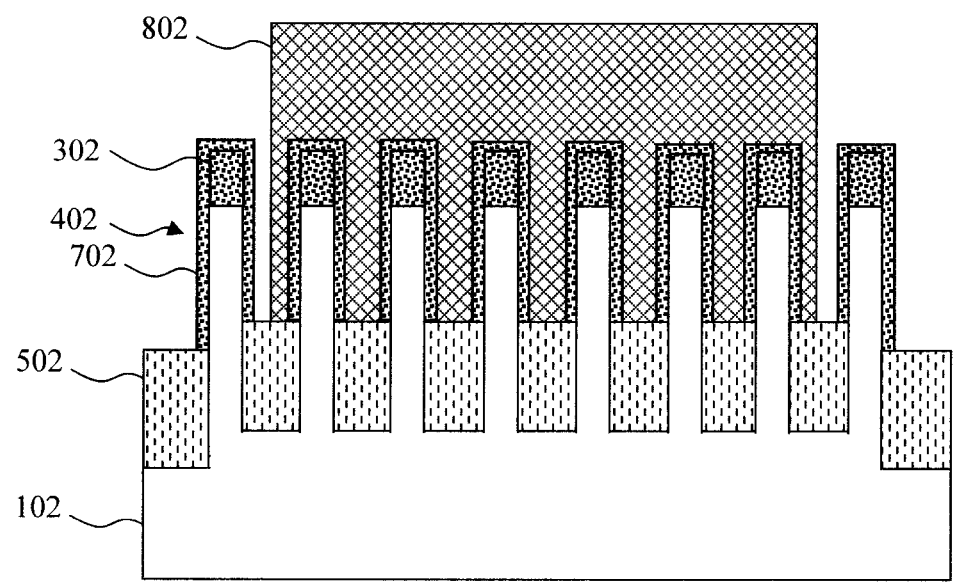
FIG. 8 is a cross-sectional diagram illustrating a mask having been formed selectively covering those fins that will serve as the active fins, while the remaining fins, i.e., what will be the dummy fins, are unmasked according to an embodiment of the present invention.
Figure 9:
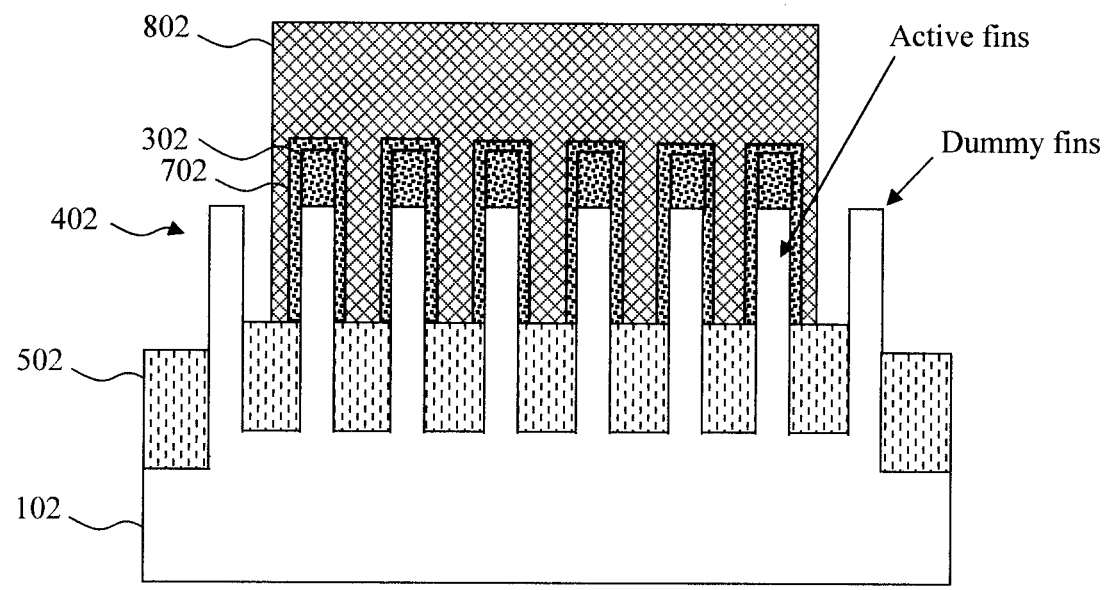
FIG. 9 is a cross-sectional diagram illustrating the sidewall spacers having been selectively removed from the (unmasked) fins according to an embodiment of the present invention.
Figure 10:
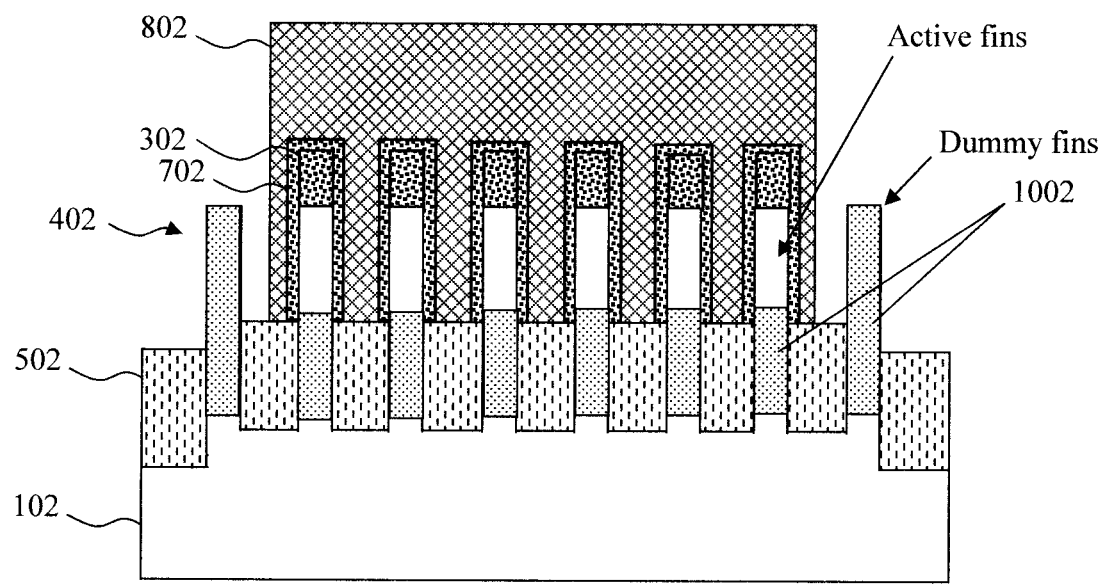
FIG. 10 is a cross-sectional diagram illustrating bottom portions of the fins below the sidewall spacers and the entire (dummy) fins having been converted to an oxide according to an embodiment of the present invention.
Figure 11:
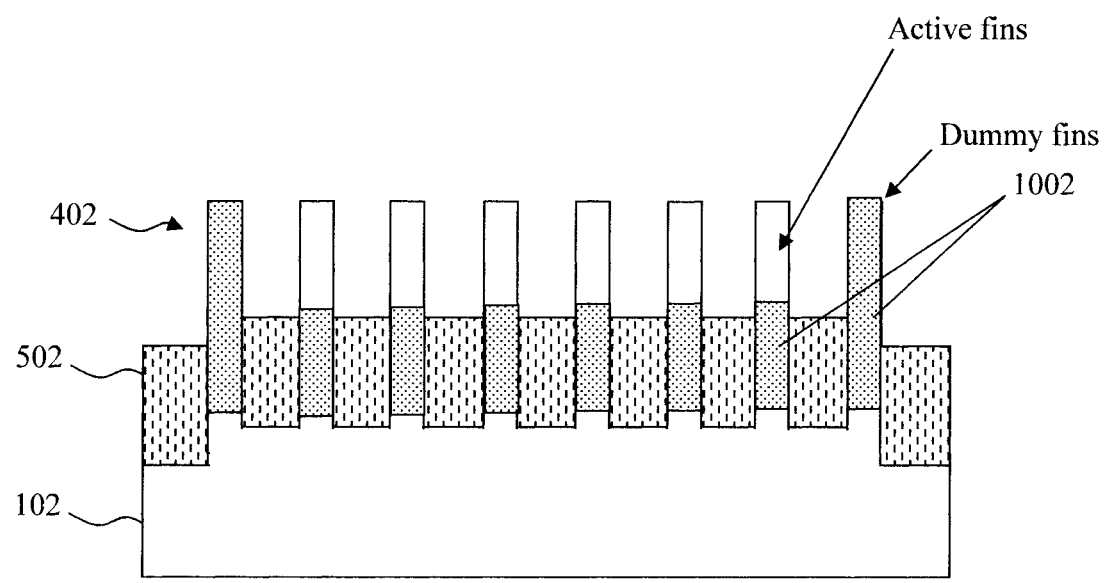
FIG. 11 is a cross-sectional diagram illustrating the remaining sidewall spacers alongside the active fins having been removed according to an embodiment of the present invention.

Namely, as shown in FIG. 8, a mask 802 is formed selectively covering those fins 402 (and respective sidewall spacers 702) that will serve as the active fins, while the remaining fins 402, i.e., what will be the dummy fins, are unmasked. According to an exemplary embodiment, mask 802 is a standard block mask.

Placing mask 802 over the active fins 402 enables the sidewall spacers 702 to be selectively removed from the (unmasked) fins 402. See FIG. 9. As provided above, the sidewall spacers 702 can be formed from a nitride material such as SiN and/or SiON. In that case, a nitride-selective etching process such as a nitride-selective RIE can be used to clear the sidewall spacers 702 from the unmasked (dummy) fins 402. As also provided above, the fin hardmasks 302 can also be a nitride material such as SiN. Thus, the etch to remove the (unmasked) sidewall spacers 702 will also remove the (unmasked) fin hardmasks 302. See FIG. 9. The fin hardmasks 302 and sidewall spacers 702 remain over the active fins. Following removal of the fin hardmasks 302 and sidewall spacers 702 (from the dummy fins), the mask 802 is also removed.

The bottom portions of the fins 402 below the sidewall spacers 702 and the entire, i.e., top/bottom portions, of the (dummy) fins 402 are then converted to an oxide 1002. See FIG. 10. According to an exemplary embodiment, this conversion process is carried out using thermal oxidation. In general, thermal oxidation involves annealing the fins 402 in an oxygen ambient. Oxygen ions from the ambient will access the bottom portions of the fins 402 by permeating through the oxide material 502 (oxygen ions can easily move through an oxide material), converting the bottom portions of the fins 402 into oxide 1002. The top portions of the exposed (dummy) fins 402 too will be converted to oxide 1002. However, the top portions of the fins 402 that are covered by sidewall spacers 702 will be blocked from oxidation (oxygen ions cannot permeate the sidewall spacers 702). These unconverted top portions are the active fins. To use a non-limiting illustrative example, if the wafer 102/fins 402 are Si, then the oxide 1002 is silicon dioxide ($SiO_2$).

Specifically, the fins 402 are annealed in an oxygen ambient under conditions sufficient to oxidize the bottom portions of the fins 402 beneath the active fins, and the (dummy) fins 402 in their entirety. According to an exemplary embodiment, the conditions include, but are not limited to, a temperature of from about 600° C. to about 1400° C., and ranges therebetween, and an annealing duration of from about 10 seconds to about 1 hour, and ranges therebetween and can be accomplished using rapid thermal annealing (RTA) or a conventional furnace process.

As a result, the active fins are now each present on the insulator 1002. The insulator 1002 acts as a shallow trench isolation (STI) region isolating the active fins from one another. No isolation is needed for the dummy fins since they are converted entirely to oxide 1002.

Following the oxidation, the remaining sidewall spacers 702 alongside the active fins are removed. See FIG. 11. As provided above, the sidewall spacers 702 can be formed from a nitride material such as SiN and/or SiON. In that case, a nitride-selective etching process such as a nitride-selective RIE can be used to clear the sidewall spacers 702 from the active fins 402. As also provided above, the fin hardmasks 302 can also be a nitride material such as SiN. Thus, the etch to remove the sidewall spacers 702 will also remove the fin hardmasks 302. See FIG. 11.

Gates are next formed over the regions of the active fins that will serve as the channel regions of the device. In the present example, a replacement metal gate process will be employed. With a replacement metal gate process, sacrificial dummy gates are first formed over the fins. The dummy gates serve as a placeholder, permitting the source and drain regions to be formed. The dummy gates are then removed and replaced with a final device gate, also referred to herein as a replacement gate. Since the replacement gate is placed near the end of the process, exposure of the replacement gate materials to potentially damaging conditions such as elevated temperatures is minimized. This 'gate-last' approach is important for high-κ metal gate stacks since high-κ gate dielectrics are particularly susceptible to damage during high-temperature anneals.

Figure 12:
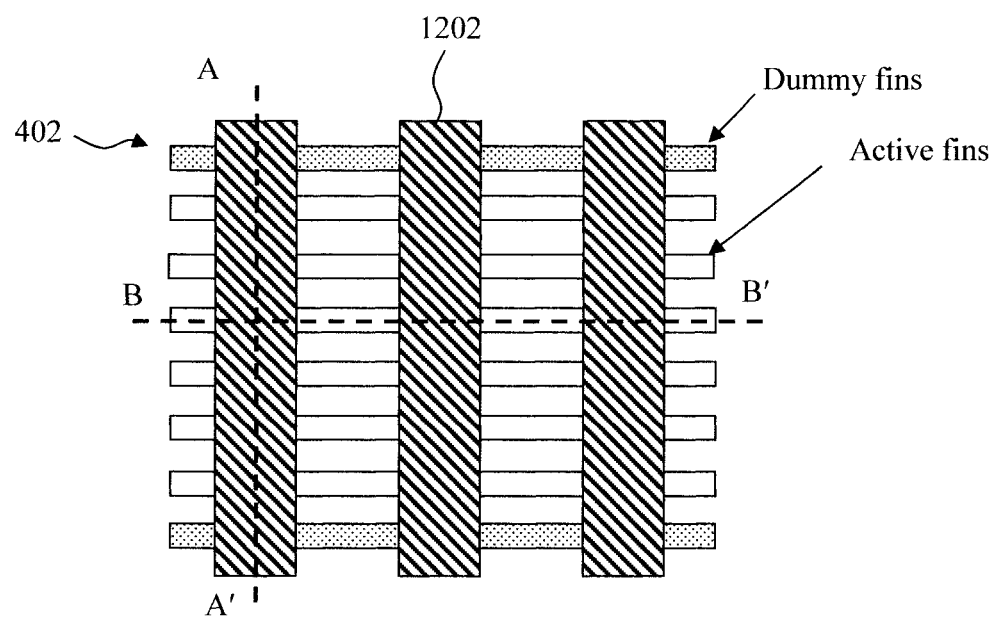
FIG. 12 is a top-down diagram illustrating dummy gates having been formed over the fins according to an embodiment of the present invention.

The cross-sectional views in FIGS. 1-11 have been perpendicular to the fins. Switching now to a top-down view, FIG. 12 illustrates a plurality of dummy gates 1202 having been formed over the fins 402. The dummy gates 1202 are formed by blanket depositing a suitable dummy gate material over the fins 402, and then using standard lithography and etching techniques to pattern the dummy gate material into individual dummy gates 1202. Suitable dummy gate materials include, but are not limited to, poly-silicon (poly-Si) and/or amorphous silicon (a-Si).

Figure 13:
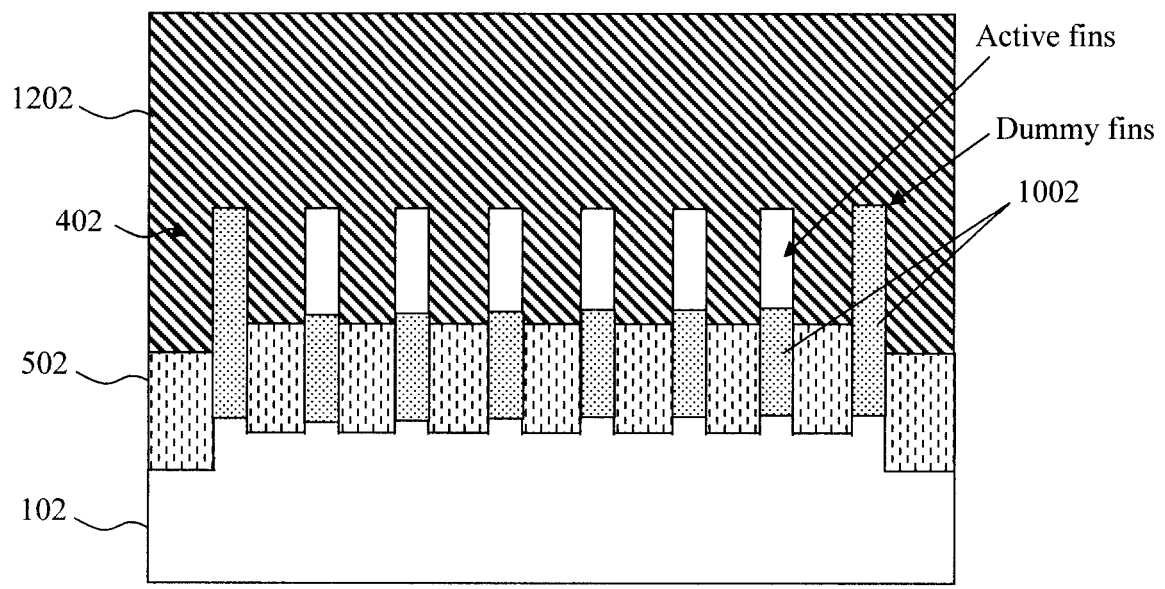
FIG. 13 is a cross-sectional diagram of a view through one of the dummy gates according to an embodiment of the present invention.

As shown in FIG. 12, several different cross-sectional views of this structure will be depicted. For instance, FIG. 13 provides a cross-sectional view A-A' through one of the dummy gates 1202, perpendicular to the fins 402. As shown in FIG. 13, each of the dummy gates 1202 is present on the oxide material 502 surrounding the active fins. The active fins have a uniform length and are disposed on oxide 1002 which provides isolation. Each of the dummy fins is entirely converted to oxide 1002.

Figure 14:
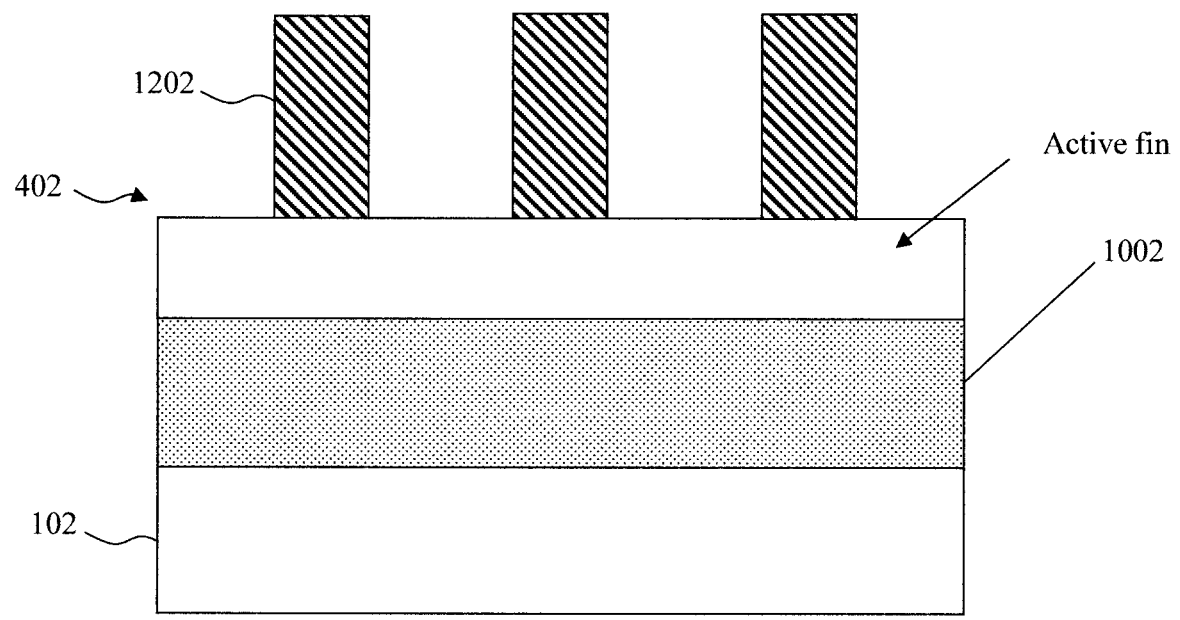
FIG. 14 is a cross-sectional diagram of a view through one of the active fins, perpendicular to the dummy gates according to an embodiment of the present invention.

FIG. 14 provides a cross-sectional view B-B' through one of the active fins 402, perpendicular to the dummy gates 1202. As shown in FIG. 14, the individual dummy gates 1202 are present on the active fin. The active fin is disposed on oxide 1002 which provides isolation.

Figure 15:
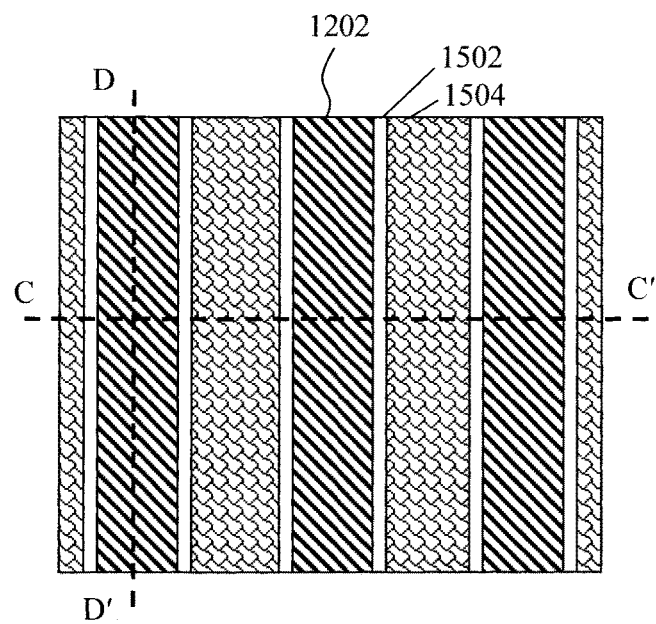
FIG. 15 is a top-down diagram illustrating gate spacers having been formed on opposite sides of the dummy gates, and source and drains having been formed on opposite sides of the dummy gates, offset from the dummy gates by the gate spacers, according to an embodiment of the present invention.

Switching again to a top-down view, as shown in FIG. 15, gate spacers 1502 are then formed on opposite sides of the dummy gates 1202. As highlighted above, the dummy gates 1202 are formed over portions of the active fins that will serve as channel regions of the device. The gate spacers 1502 offset the gates from what will be the source and drains of the device. According to an exemplary embodiment, the gate spacers 1502 are formed by blanket depositing a suitable spacer material, and then using a directional etch (e.g., RIE) to pattern the spacer material into individual gate spacers 1502. Suitable spacer materials include, but are not limited to, oxide materials such as $SiO_2$ or nitride materials such as SiN and/or SiON.

Source and drains 1504 are then formed on opposite sides of the dummy gates 1202, offset from the dummy gates 1202 by the gate spacers 1502. According to an exemplary embodiment, source and drains 1504 are formed from an in-situ doped (i.e., during growth) epitaxial material such as in-situ doped epitaxial Si, silicon carbide (SiC) and/or SiGe. Suitable n-type dopants include but are not limited to phosphorous (P), and suitable p-type dopants include but are not limited to boron (B). The use of an in-situ doping process is merely an example. For instance, one may instead employ an ex-situ process such as ion implantation to introduce dopants into the source and drains 1504.

Figure 16:
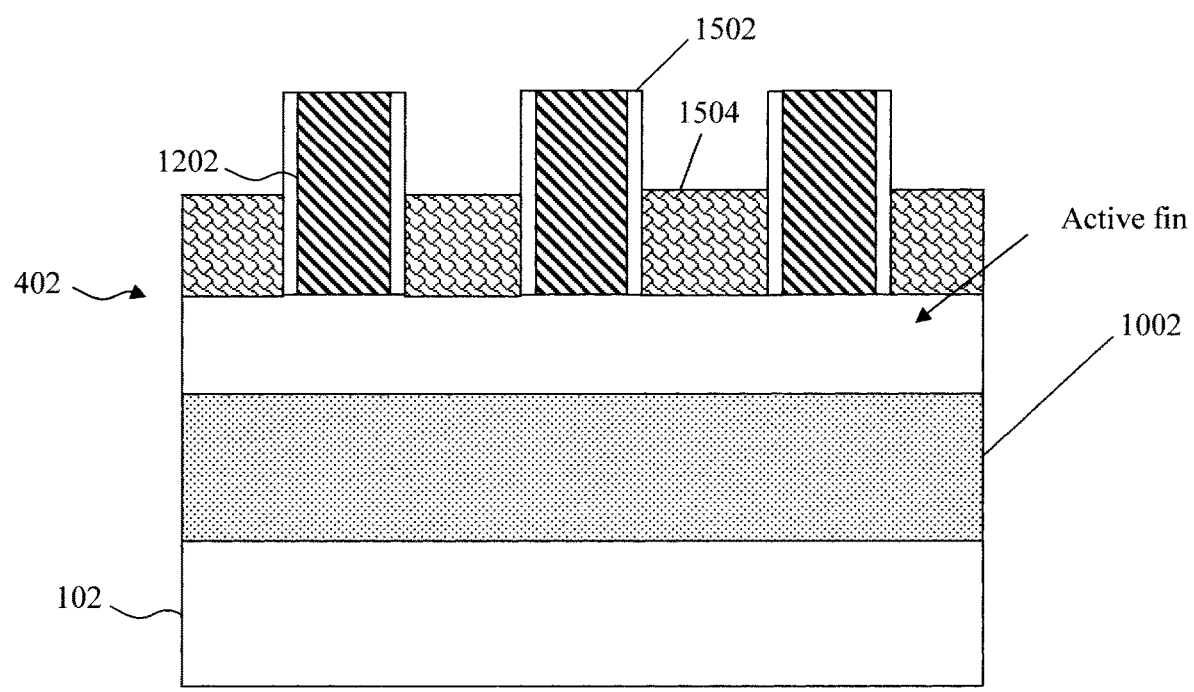
FIG. 16 is a cross-sectional diagram of a view through one of the active fins, perpendicular to the dummy gates according to an embodiment of the present invention.

As shown in FIG. 15, different cross-sectional views of this structure will be depicted. For instance, FIG. 16 provides a cross-sectional view C-C' through one of the active fins 402, perpendicular to the dummy gates 1202. As shown in FIG. 16, the source and drains 1504 are present on opposite sides of the dummy gates 1202, offset from the dummy gates 1202 by the gate spacers 1502.

Figure 17:
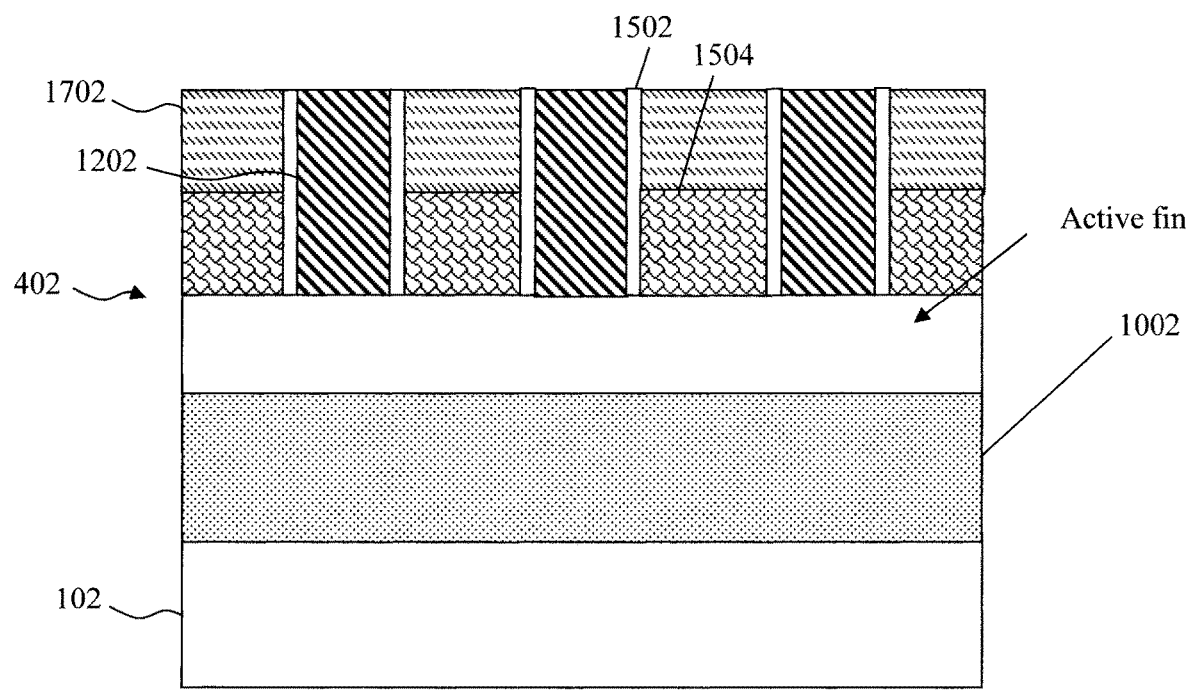
FIG. 17 is a cross-sectional diagram of a view through one of the active fins, perpendicular to the dummy gates illustrating the dummy gates having been buried in a dielectric material according to an embodiment of the present invention.

Continuing with a cross-sectional view C-C', as shown in FIG. 17 the dummy gates 1202 are next buried in a dielectric material 1702. Suitable dielectric materials include, but are not limited to, organic planarizing layer (OPL) materials. Once deposited, the dielectric material 1702 is then polished down to the surface of the dummy gates 1202. See FIG. 17.

Figure 18:
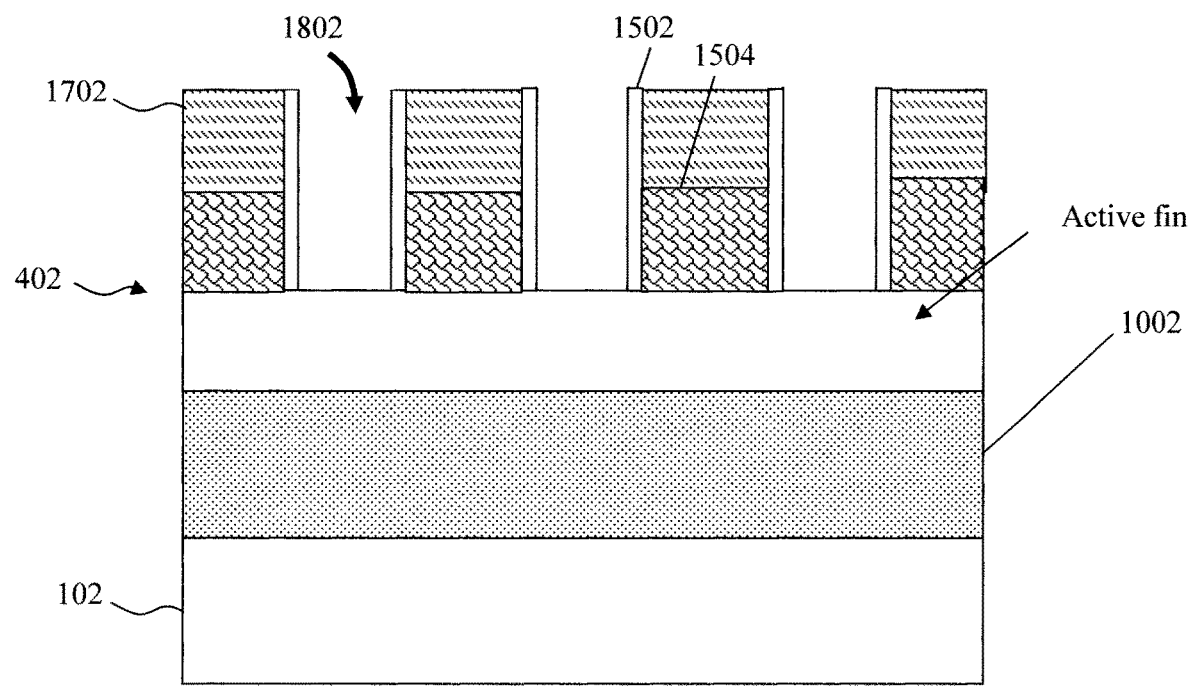
FIG. 18 is a cross-sectional diagram of a view through one of the active fins, perpendicular to the dummy gates illustrating the dummy gates having been selectively removed, forming gate trenches in the dielectric material according to an embodiment of the present invention.

Deposition of dielectric material 1702 permits the selective removal of the dummy gates 1202. Namely, as shown in FIG. 18 (a cross-sectional view C-C'), the dummy gates 1202 have been selectively removed, forming gate trenches 1802 in the dielectric material 1702. As provided above, the dummy gates 1202 can be formed from poly-Si and/or a-Si. In that case, a Si-selective etching process can be used to remove the dummy gates 1202.

Figure 19:
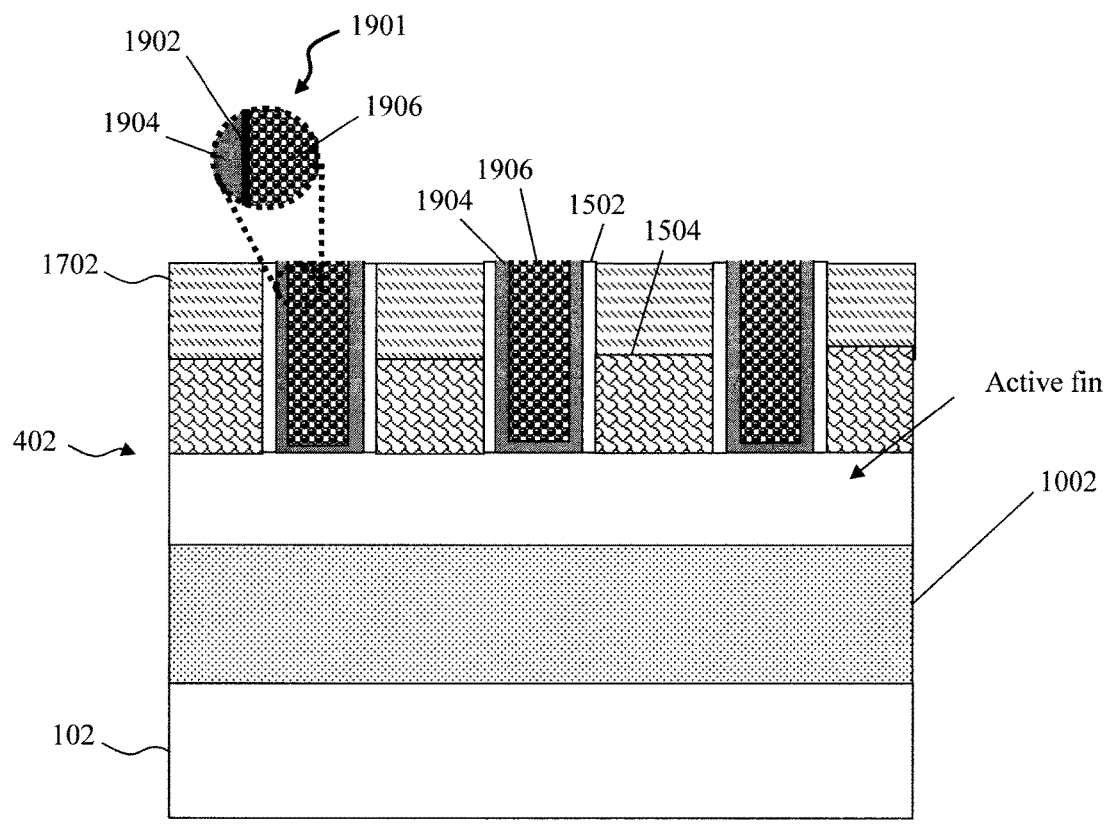
FIG. 19 is a cross-sectional diagram of a view through one of the active fins, perpendicular to the dummy gates illustrating replacement gates having been formed in the gate trenches according to an embodiment of the present invention.

Replacement gates are then formed in the gate trenches 1802. According to an exemplary embodiment, the replacement gates are high-κ metal gates. Namely, as shown in FIG. 19 (a cross-sectional view C-C'), the high-κ metal gates include an interfacial layer (IL) 1902 (see magnified view 1901) on the exposed active fins, a high-κ gate dielectric 1904 over the IL 1902, and a workfunction metal 1906 over the high-κ gate dielectric 1904.

According to an exemplary embodiment, IL 1902 is an interfacial oxide formed selectively on exposed surfaces of the active fins by an oxidation process to a thickness of from about 0.3 nm to about 5 nm, and ranges therebetween, e.g., about 1 nm. The high-κ gate dielectric 1904 is then deposited over the IL 1902 using a conformal deposition process such as chemical vapor deposition (CVD) or atomic layer deposition (ALD). The workfunction metal 1906 is deposited over the high-κ gate dielectric 1904 using a process such as CVD, ALD, electrochemical plating, etc. so as to fill the gate trenches 1802.

The particular workfunction metal employed can vary depending on whether an n-type or p-type transistor is desired. Suitable n-type workfunction metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$).

Figure 20:
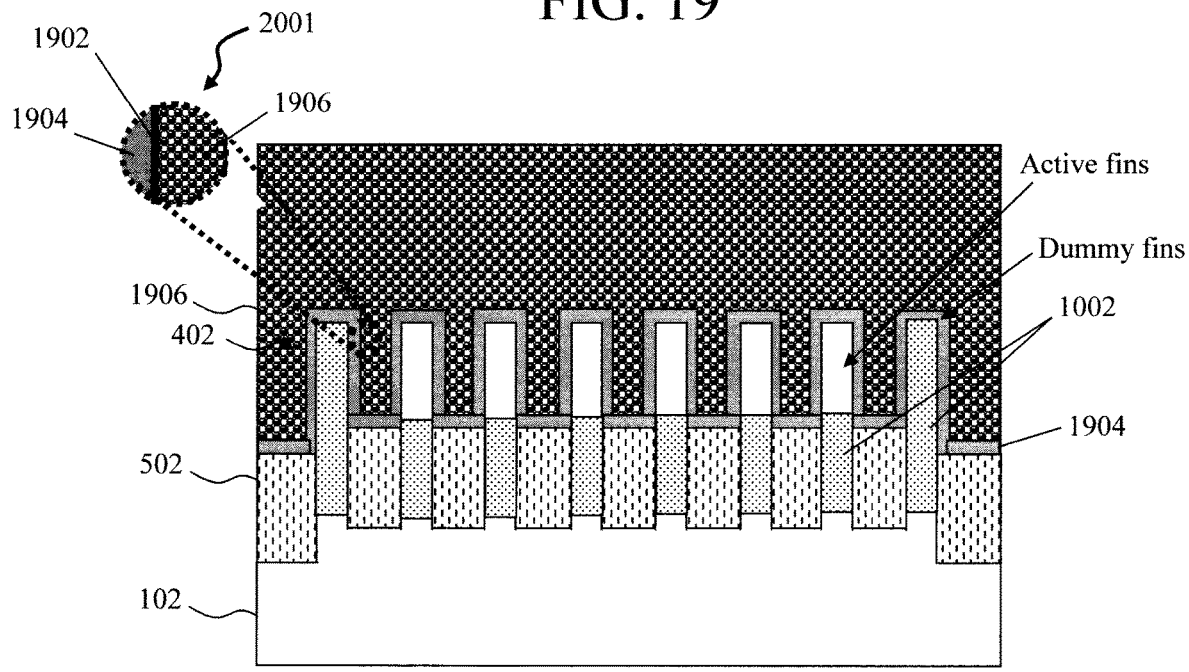
FIG. 20 is a cross-sectional diagram of a view through one of the replacement gates according to an embodiment of the present invention.

FIG. 20 provides a cross-sectional view D-D' through one of the active fins 402, perpendicular to the gates. As shown in FIG. 20, gates (i.e., IL 1902, high-κ gate dielectric 1904 and workfunction metal 1906—see magnified view 2001) are present over the active and dummy fins. However, the dummy fins have been converted (in their entirety) to the oxide 1002. Thus, only the active fins will provide device channels beneath the gates.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A method for forming a fin field effect transistor (finFET) device, comprising:
  patterning fins in a wafer, wherein the fins comprise a sea of fins, wherein one or more of the fins at outer edges of the sea of fins have patterning depth variations and will serve as dummy fins, and wherein another one or more of the fins located between the dummy fins in the sea of fins serve as active fins of the finFET device;
burying the fins in an oxide material;
recessing the oxide material to form a recessed oxide material in between the fins;
selectively forming sidewall spacers, above the recessed oxide material, alongside top portions of the active fins;
converting, using a same oxidation process, i) bottom portions of the active fins beneath the sidewall spacers to an oxide, such that the active fins are present on the oxide, and ii) the dummy fins entirely to the oxide; and
forming gates over the active fins;
wherein the sidewall spacers are absent from the dummy fins;
further comprising the steps of:
forming the sidewall spacers, above the recessed oxide material, alongside top portions of the fins; and
removing the sidewall spacers from the dummy fins;
further comprising the steps of:
forming a block mask over the sidewall spacers formed alongside the top portions of the active fins; and
removing the block mask after the sidewall spacers have been removed from the dummy fins.

2. The method of claim 1, wherein the converting comprises the step of:
oxidizing the bottom portions of the active fins through the recessed oxide material.

3. The method of claim 2, wherein the oxidizing comprises the step of:
annealing the fins in an oxygen ambient under conditions sufficient to oxidize the bottom portions of the active fins.

4. The method of claim 3, wherein the conditions comprise a temperature and a duration.

5. The method of claim 4, wherein the temperature is from about 600° C. to about 1400° C., and ranges therebetween.

6. The method of claim 4, wherein the duration is from about 10 seconds to about 1 hour, and ranges therebetween.

7. The method of claim 1, further comprising the steps of:
forming dummy gates over the fins;
forming source and drains on opposite sides of the dummy gates;
burying the dummy gates in a dielectric material;
selectively removing the dummy gates, thereby forming gate trenches in the dielectric material; and
forming the gates in the gate trenches.

8. The method of claim 7, wherein the dummy gates comprise a material selected from the group consisting of: poly-silicon, amorphous silicon, and combinations thereof.

9. The method of claim 1, wherein the gates comprise:
an interfacial layer on the active fins;
a high-κ gate dielectric over the interfacial layer; and
a workfunction metal over the high-κ gate dielectric.

10. The method of claim 9, wherein the high-κ gate dielectric is selected from the group consisting of: hafnium oxide ($HfO_2$), lanthanum oxide ($La_2O_3$), and combinations thereof.

11. The method of claim 9, wherein the workfunction metal is selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

* * * * *